US007848717B2

(12) United States Patent
Liu

(10) Patent No.: US 7,848,717 B2
(45) Date of Patent: Dec. 7, 2010

(54) METHOD AND SYSTEM FOR OUT OF BAND PREDISTORTION LINEARIZATION

(75) Inventor: Xiaowei Liu, Shenzhen (CN)

(73) Assignee: ZTE Corporation, Guangdong (CN)

( * ) Notice: Subject to any disclaimer, the term of this patent is extended or adjusted under 35 U.S.C. 154(b) by 553 days.

(21) Appl. No.: 11/722,294

(22) PCT Filed: Dec. 21, 2004

(86) PCT No.: PCT/CN2004/001490

§ 371 (c)(1),
(2), (4) Date: Jun. 20, 2007

(87) PCT Pub. No.: WO2006/066452

PCT Pub. Date: Jun. 29, 2006

(65) Prior Publication Data

US 2008/0106333 A1 May 8, 2008

(51) Int. Cl.
*H04B 1/04* (2006.01)
(52) U.S. Cl. .................. 455/114.3; 455/67.13; 455/126
(58) Field of Classification Search .............. 455/115.1, 455/126.1, 67.11, 127.1, 136, 194.2, 226.1, 455/296, 278.1, 114.1, 114.2, 114.3, 127.2, 455/126
See application file for complete search history.

(56) References Cited

U.S. PATENT DOCUMENTS

| 4,943,783 A * | 7/1990 | Nojima ........................ 330/149 |
| 5,077,532 A * | 12/1991 | Obermann et al. .......... 330/151 |
| 5,574,990 A | 11/1996 | Flanagan |
| 6,081,158 A | 6/2000 | Twitchell et al. |
| 6,175,270 B1 * | 1/2001 | Vannucci ........................ 330/2 |
| 6,240,278 B1 * | 5/2001 | Midya et al. ................. 455/126 |
| 6,600,792 B2 | 7/2003 | Antonio et al. |
| 6,717,464 B2 * | 4/2004 | Fudaba et al. ................ 330/149 |
| 6,785,342 B1 | 8/2004 | Isaksen et al. |
| 7,053,709 B1 * | 5/2006 | Darvish-Zadeh et al. .... 330/149 |
| 7,113,551 B2 * | 9/2006 | Sills et al. .................... 375/297 |
| 7,183,847 B2 * | 2/2007 | Suzuki et al. ................ 330/149 |
| 7,340,223 B1 * | 3/2008 | Wright et al. ................. 455/91 |
| 7,583,754 B2 * | 9/2009 | Liu ............................ 375/297 |
| 2002/0101938 A1 * | 8/2002 | Horaguchi et al. ........... 375/297 |
| 2003/0104794 A1 * | 6/2003 | Yang et al. ................... 455/118 |
| 2004/0179629 A1 | 9/2004 | Song et al. |

FOREIGN PATENT DOCUMENTS

| CN | 1206251 A | 1/1999 |
| EP | 629055 A2 | 12/1994 |

* cited by examiner

*Primary Examiner*—Duc M Nguyen

(57) ABSTRACT

The present invention discloses a method and a system for out-of-band predistortion linearization, comprising steps of: dividing base band inputted or intermediate frequency signal into an in-band signal branch and an out-of-band signal branch; processing the in-band signal to form RF (Radio Frequency) signal; processing the out-of-band signal to form out-of-band predistortion signal for pre-compensating the in-band signal; adding the in-band signal with the out-of-band predistortion signal, and taking the result as the input of RF power amplifier. The present invention compensates the nonlinear distortion of the RF power amplifier by a way of out-of-band compensating signal in a wireless communication environment, thereby avoiding the limitation of improving performance of conventional predistortion method, and solving the limitation of bandwidth and capability of the predistortion system caused by memory effect.

12 Claims, 6 Drawing Sheets

METHOD AND SYSTEM FOR OUT OF BAND PREDISTORTION LINEARIZATION

RELATED APPLICATIONS

The present application is based on, and claims priority from, International Application Number PCT/CN2004/001490, filed Dec. 21, 2004, the disclosure of which is hereby incorporated by reference herein in its entirety.

TECHNICAL FIELD

The present invention relates to a linearization method for radio transmitter and a system thereof, and more particularly to a method and a system adopting out-of-band predistortion linearization technique to improve the linearity of the radio transmitter.

BACKGROUND OF THE INVENTION

In recent years, with the rapid development of wireless communication throughout the world, resources of radio frequency spectrum becomes more and more insufficient. In order to utilize the finite spectrum resources effectively, many wireless communication systems have adopted linear modulation which has a high rate of spectrum utilization. Since both the phase and amplitude of linear modulation signals carry useful information, any nonlinear amplification of these signals will increase bit error rate and disturb adjacent radio channels. These two adverse effects should be absolutely avoided when designing wireless communication systems, therefore the linear modulation signal must be amplified with high linearity.

A typical practice to increase the linearity of RF (Radio Frequency) power amplifier is to make the output power of the amplifier far below the 1 dB compression point of the amplifier, i.e., only a short relatively linear section of input/output characteristic of RF power amplifier is used to obtain a highly linear amplification. This method is called power back-off. However, this power back-off technique has the following obvious disadvantages: firstly, the improvement of linearity according to this method is at expense of power efficiency of the amplifier, which means that the power output capability of the amplifier is not fully utilized, therefore decreasing the power efficiency of the amplifier and increasing the cost; secondly, the low power efficiency means that most power is released in the form of heat, bringing a huge pressure on the ventilation and heat dispersion system of the whole base station; finally, an amplifier of low power efficiency needs an electrical power system with larger capacity, which is also an important factor for the increased cost of transmitter.

In order to increase the power efficiency of the RF power amplifier and decrease the cost of transmitter, a typical method is to make the power amplifier work in a state of lower linearity and higher power efficiency, then increase the linearity of the amplifier at outside through certain measures. These measures are called linearization technique.

Both the two techniques, feed-forward linearization and feedback linearization, have been widely used in all kinds of wireless communication systems. But both these two techniques have limitations: the main problem of the feed-forward technique lies in poor power efficiency, complicated structure and high cost of the RF power amplifier; while the feedback technique has the problem of unstable loop and limited linearization bandwidth. Therefore, neither of the above two techniques can offer highly linear amplification on wide frequency band with the power efficiency required by next generation mobile communication base station.

Another typical linearization technique is predistortion technique, which can obtain higher power efficiency than the feed-forward technique. Different from the feed-forward technique, this predistortion technique implements compensation before the signal amplification, i.e., the input signal is pre-distorted in advance in a way opposite to the nonlinear characteristic of the amplifier, so that the whole effect of the signal predistortion and nonlinear amplification approximates to the linear amplification. The predistortion technique can be classified into digital base band predistortion, analogue base band or intermediate frequency predistortion, RF predistortion, etc., among which, the adaptive digital base band predistortion technique based on digital signal processing has been developed rapidly in recent years. The usual digital base band predistortion technique stores predistortion compensation parameters that have been calculated beforehand in a 1-D predistortion Look-Up table (LUT), calculates an address according to the current amount of the input signals, and then corrects the input signals in a certain way after finding one or a group of corresponding predistortion compensation parameters in corresponding positions in the predistortion Look-Up table.

However, if without special measures, both the linearization bandwidth and linearization capacity that can be provided by the digital predistortion linearization method will be very limited. The reasons are: on one hand, this predistortion technique implicates an unavoidable paradox that, in order to compensate part of non-linearization, the amplifier is set in a more nonlinear state resulting in impossibility of compensation in some conditions, therefore the compensation effect has a close relation with back off of the amplifier and peak-to-average ratio of the input signal; on the other hand, the amplifier has memory effect which greatly influences the predistortion effect. With regard to time domain, when memory effect exists, the distortion characteristic of the amplifier will relate not only to the current input, but also to its previous input; with regard to frequency domain, when memory effect exists, the amplitude and phase of the nonlinear distortion component of the amplifier will vary along with the modulation frequency of the input signal, and such a varying distortion signal can not be totally compensated by the predistortion signal having constant amplitude and phase.

In the international application PCT/CN/00774 entitled "A Method and a System of Wideband Predistortion Linearization" which was filed on Oct. 31, 2002 by this inventor, a method for wideband predistortion linearization and a device thereof are provided, wherein, the compensation for amplifier's AM-PM distortion, i.e., non-linear phase distortion is realized in band (the "in band" means the compensation signal and original signal are always in the same frequency band); and the compensation for amplifier's AM-AM distortion (nonlinear amplitude distortion) and memory effect is realized out of band (the "out of band" means the frequency band where the compensation signal locates is far from the frequency band where the original signal locates, and these two signals do not overlap with each other). One the one hand, this method can compensate the memory effect of the amplifier and extend the linearization bandwidth of the same, on the other hand, since the aforementioned paradox of the conventional predistortion method can be avoided, this method enables the amplifier work in a state more approximating to 1 dB compression point, thereby further increasing the efficiency of the amplifier.

However, in this method, in order to compensate the AM-PM distortion, part of the predistortion has to be processed in band, so the system is required to provide base band I, Q signals respectively, which will be inconvenient in some application environments, especially in wireless communication field. The reasons are: compared with separated I, Q information streams in digital base band, in the case of radio frequency (RF) or intermediate frequency (IF), the I, Q signals carrying the I, Q information streams are compound I, Q signals that have been modulated, therefore in some digital predistortion systems required to provide independent I, Q signals respectively, an extra I, Q demodulation process will be needed; however, most RF power amplifiers are produced by particular manufactures, so sometimes it is inconvenient to modify the design of the digital base band for adding the predistortion function. Therefore, a method that can directly use the compound I, Q signals in RF and IF to achieve complete predistortion compensation is desired.

SUMMARY OF THE INVENTION

The object of the present invention is to provide a method and a system for out-of-band predistortion linearization in a wireless environment, directly using compound I, Q signals and compensating the nonlinear distortion of RF power amplifier by way of out-of-band compensation signals, so as to increase the linear bandwidth that can be offered by the predistortion technique and enhance the linearization performance that can be obtained through the predistortion technique.

In order to achieve the above object, according to one aspect of the present invention, a method for out-of-band predistortion linearization is provided, comprising the steps of: dividing the inputted base band or IF signal into in-band signal branch and out-of-band signal branch; processing said in-band signal to form RF signal; processing said out-of-band signal to form out-of-band predistortion signal for pre-compensating said in-band signal; adding said in-band signal to said out-of-band predistortion signal, and taking the result as the input of the RF power amplifier.

Preferably, said step of processing in-band signal further includes: performing delay compensation for said in-band signal so as to keep the in-band signal synchronized with said out-of-band signal; up-converting said in-band signal after being delay-compensated to a corresponding RF.

Preferably, said step of processing out-of-band signal further includes: extracting power envelope from said out-of-band signal; dividing said out-of-band signal into two signal branches; processing one of said two out-of-band signal branches to form second harmonic predistortion signal; processing the other branch to form envelope injection predistortion signal with low frequency; adding the above two processed branches of out-of-band signal together and taking the result as said out-of-band predistortion signal.

Preferably, said step of processing one of the two out-of-band signal branches further includes: proportional adjusting this signal branch; up-converting the adjusted signal branch to second harmonic frequency; performing phase shift for the up-converted signal branch to form said second harmonic predistortion signal.

Preferably, said step of processing the other branch of the two out-of-band signal branches further includes: dividing this signal branch into three sub-branches; proportionally adjusting one of the three sub-branches; electronically FIR filtering the another one of the three sub-branches to compensate the electrical memory effect of the amplifier; thermally FIR filtering the third one of the three sub-branches to compensate the thermal memory effect of the amplifier; adding the above three processed sub-branches together, and taking the result as said envelope injection predistortion signal.

According to another aspect of the present invention, a system for out-of-band predistortion linearization is provided, comprising: an in-band signal processing part, for processing in-band signal branch to form in-band RF signal; an out-of-band predistortion processing unit, for processing out-of-band signal branch to form out-of-band predistortion signal for pre-compensating said in-band signal; a signal adder, for adding the in-band RF signal formed by said in-band signal processing part with the out-of-band predistortion signal formed by said out-of-band predistortion processing unit; wherein, the base band or IF signal inputted to the system are divided into an in-band signal branch and an out-of-band signal branch, these two branches enter into said in-band signal processing part and out-of-band predistortion processing unit respectively, and after being processed, form the in-band RF signal and out-of-band predistortion signal respectively, which are added together in said signal adder to serve as the input of the RF power amplifier.

Preferably, said in-band signal processing part further includes: a delay compensation unit, for delay compensating said in-band signal so as to keep it synchronized with said out-of-band signal; an up-conversion unit, for up-converting said delay compensated in-band signal to the RF; wherein, after being delay compensated by said delay time compensation unit, said in-band signal enters into said up-conversion unit, and, after being up-converted, get to said signal adder.

Preferably, said out-of-band predistortion processing unit further includes: a power envelope extraction unit, for extracting power envelope of the inputted out-of-band signal; a second harmonic injection part, for processing one of the out-of-band signal branches that have be extracted the power envelop to form the second harmonic predistortion signal; an envelope signal injection part, for processing the other branch of the out-of-band signal branches that have be extracted the power envelop to form the envelope injection predistortion signal; wherein said out-of-band signal enters into said power envelope extraction unit firstly, and, after being extracted the power envelop, is divided into two branches, said two branches enter into the second harmonic injection part and the envelope signal injection part respectively to form the second harmonic predistortion signal and envelope injection predistortion signal, which get to said signal adder at the same time.

Preferably, said second harmonic injection part further includes: a proportion unit, for adjusting the amplitude of signal that has entered into said second harmonic injection part; a second harmonic up-conversion unit, for up-converting the proportionally adjusted signal to the second harmonic frequency; a phase shifter, for shifting the phase of the up-converted signal by an angle; wherein said out-of-band signal that has entered into the second harmonic injection part firstly gets to said proportion unit for adjusting, then is up-converted by said second harmonic up-conversion unit, then its phase is shifted by said phase shifter, and finally form said second harmonic predistortion signal.

Preferably, said envelope signal injection part further includes: a proportion unit, for adjusting amplitude of one signal branch that has entered into the envelope signal injection part; an electronic FIR filter, for electronically FIR filtering the another signal branch that has entered into the envelope signal injection part so as to compensate the electronic memory effect of the amplifier; a thermal FIR filter, for thermally FIR filtering the third signal branch that has entered into the envelope signal injection part so as to compensate the thermal memory effect of the amplifier; a signal adder, for adding up the three signal branches that are from said proportion unit, electronic FIR filter and thermal FIR filter respectively; wherein the signals entering into the envelope signal injection part are divided into three branches, one of which enters into said proportion unit, another into said electronic FIR filter, and the third into said thermal FIR filter, these three signal branches are processed respectively and then are added up in said signal adder to form said envelope injection predistortion signal.

The first advantage of the present invention is that: it can produce the out-of-band predistortion signal by directly using the I, Q compound signal of IF or RF (apparently, it can also directly use the digital base band signal) while not needing compensation in the digital base band of the system, as such it makes it possible to design the predistortion system independent of the base band system. This feature greatly facilitates and simplifies the design and application of the predistortion system, moreover, the linearization system designed according to this method can be combined with the RF power amplifier to form an independent unit module. All current digital predistortion systems need to be processed in the digital base band, so the interface and system compatibility have to be considered, largely limiting the application scope of the predistortion linearization system. However, the method and system of this invention are able to get rid of this restriction.

The second advantage of the present invention is that a higher compensation precision can be achieved than that of the conventional predistortion methods. In one embodiment of this invention, since the out-of-band predistortion signal and the input RF signal of the amplifier are not in the same frequency band, when converting from the digital domain to the analog domain, the precision of the out-of-band predistortion signal is totally decided by the precision of the digital-to-analog converter (DAC). Whereas in the conventional predistortion methods, the compensation signal and useful signal are in the same frequency band and their amplitudes are overlapped, so only a part of bits of the DAC can be used to distinguish the predistortion signal, thus the quantization error of the predistortion signal totally depends on the relative amount of the original signal in regard to the predistortion signal. However, the original signal is usually over ten times or even several tens of times of the predistortion signal, causing a considerable quantization error of the predistortion signal. For example, supposing the DAC has 12 bits, and the original signal is 10-20 times higher than the predistortion signal, i.e., approximately 24 times of the predistortion signal, then for the conventional predistortion methods, the effective quantization precision of the predistortion signal will be only about 8 bits; while if the out-of-band predistortion method and system of the present invention are applied, the effective quantization precision of the predistortion signal will be 12 bits, approximately ten times higher than that of the conventional methods.

The third advantage of the present invention is that the memory effect of the amplifier can be effectively compensated. The memory effect of the amplifier causes that the nonlinear intermodulation distortion outputted by the amplifier not only depends on the current input signal, but also on the previous input signal. The memory effect of the amplifier requires the amplitude and phase of the compensation signal to be able to vary along with this characteristic of ever changing distortion. The memory effect of the amplifier mainly has two styles, one is electronic memory effect and the other is thermal memory effect, either of which is closely related to the power envelope of the input signal. In conventional predistortion methods, the memory effect is considered in the digital base band, wherein the predistortion signal is up-converted to the RF together with the original signal, which is equivalent to using a RF predistortion signal to compensate the nonlinear intermodulation distortion caused by the characteristic of the amplifier at the power envelope frequency, such kind of compensation to the memory effect is indirect; on the other hand, since the RF power amplifier is only a part of the whole transmitter link, and the frequency characteristic caused by the memory effect of the amplifier is probably submerged in the influence of other components, it is very difficult to distinguish and at the same time effectively compensate the real memory effect. However, the out-of-band predistortion method applies an out-of-band predistortion signal which has low frequency and is closely related to the power envelope of the amplifier to compensate the memory effect of the amplifier. Since in this method, the compensation signal and the power envelope of the input signal are in the same frequency band, and the compensation signal is directly injected into the amplifier which means it will not be affected by other components, the compensation of this method to the memory effect of the amplifier is direct in regard to the conventional predistortion methods. Compared with indirect compensation, the direct compensation has a better effect and is easier to be implemented.

The method and system for out-of-band predistortion linearization of this invention is able to compensate the nonlinear intermodulation distortion of the RF power amplifier, especially to effectively compensate the memory effect of the amplifier. Compared with the existing digital predistortion technique, the system of this invention essentially overcomes the limitation of the predistortion effect caused by the memory effect, significantly improves the linearization performance of the predistortion system, largely expands the linearization bandwidth of the predistortion system, and reduces the cost of the predistortion linearization system.

PREFERRED EMBODIMENTS

Preferred embodiments of the present invention will be described in further detail with reference to the accompanying drawings.

Figure 1:
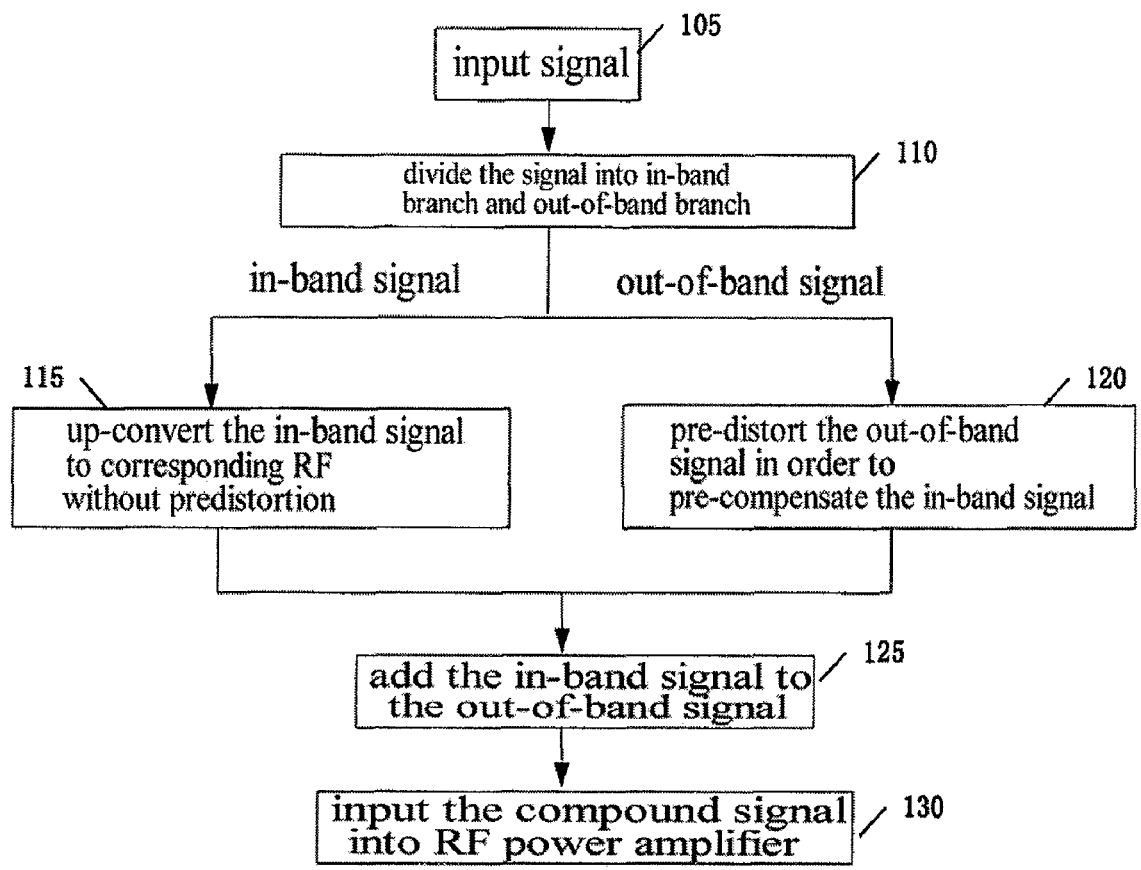
FIG. 1 is a flow chart of the out-of-band predistortion linearization method according to one embodiment of this invention.

FIG. 1 is a flow chart of a method for out-of-band predistortion linearization in accordance with an embodiment of the present invention. Steps of the method will be described in detail with reference to FIG. 1.

As shown in FIG. 1, firstly in step 105, receiving the base band or IF signals to be input into the RF power amplifier.

step 110, directly dividing the received base band or IF signals into two branches, i.e., an in-band signal branch and an out-of-band signal branch, thus, the original base band or IF signals being divided into a branch of in-band signals and a branch of out-of-band signals.

step 115, processing the in-band signals, directly up-converting the in-band signals to a corresponding radio frequency, which means the in-band signals are not processed for predistortion; in this step, first performing delay compensation for the in-band signals based on the time delay introduced through the process of out-of-band predistortion, so as to make the in-band signals and the out-of-band predistortion signals arrive at the input terminal of the RF power amplifier simultaneously; then up-converting the in-band signals that have been performed delay compensation to a corresponding radio frequency to form in-band RF signals.

step 120, performing predistortion for the out-of-band signals so as to pre-compensate the in-band signals; in this step, first extracting the power envelope of the out-of-band signals; then dividing the extracted envelope signals into two branches, with one branch being processed to form second harmonic predistortion signals, and the other to form envelope injection predistortion signals with a low frequency, these two branches of signals being called out-of-band predistortion signals jointly;

wherein, the procedure of forming the second harmonic predistortion signals in this step is as follows: adjusting the envelope signals of this branch to an appropriate amplitude; then up-converting the envelope signals of this branch to second harmonic frequency to form the second harmonic signals; then, shifting the phase of the second harmonic signals by an appropriate angle to form second harmonic predistortion signals; and the procedure of forming the envelope injecting predistortion signals in this step is as follows: further dividing the envelope signals of this branch into three sub-branches; adjusting the upper branch signals proportionally, electronically FIR filtering the middle branch signals to compensate electronic memory effect of the power amplifier, and thermally FIR filtering the lower branch signals to compensate thermal memory effect of the power amplifier.

It should be noted that for the convenience of illustration, step 115 and step 120, in which in-band signals and out-of-band signals are processed respectively, are described in sequence. But it should be understood that step 115 and step 120 in this method are carried out simultaneously.

step 125, performing broadband adding for the in-band RF signals and out-of-band predistortion signals processed by step 115 and step 120 respectively.

step 130, sending the combined signals to the RF power amplifier to be amplified to form output power signals.

Additionally, a feedback adjustment part may also be included in this embodiment for adaptively adjusting the parameters which are used for compensation during the process of out-of-band predistortion. Specifically, a part of the output signals of the amplifier are taken as feedback signals; the power envelope of the feedback signals is extracted; the amount of the intermodulation distortion component is calculated according to the power envelope signals fed back, and the compensation parameters of the out-of-band predistortion are adaptively adjusted based on the amount of the intermodulation distortion component calculated.

Figure 2:
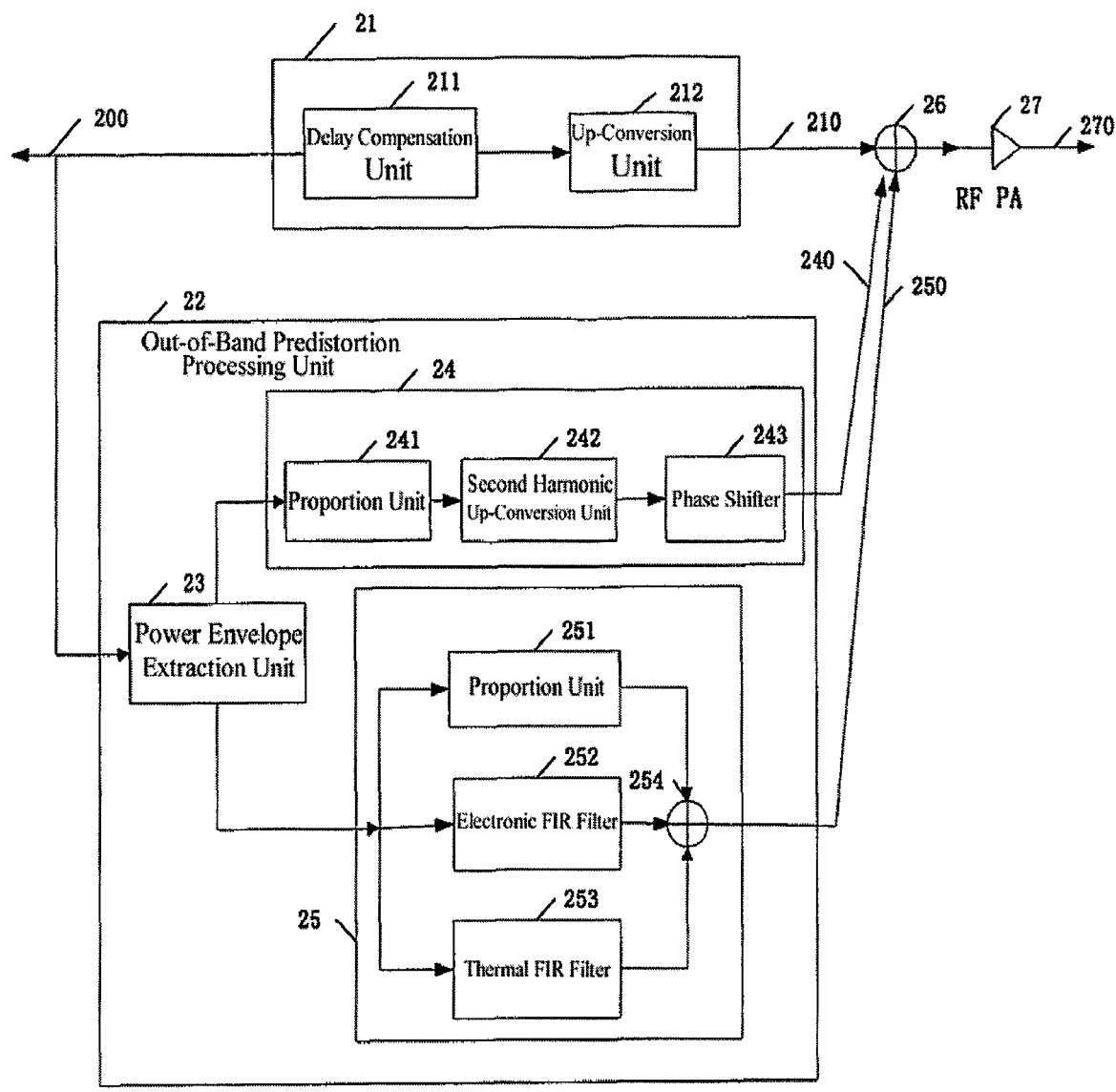
FIG. 2 is a structural diagram of the out-of-band predistortion linearization method according to one embodiment of this invention.

FIG. 2 is a structural diagram of a system for out-of-band predistortion linearization in accordance with an embodiment of the present invention. As shown in FIG. 2, the system for out-of-band predistortion linearization of this embodiment includes:

an in-band signal processing unit 21, an out-of-band predistortion processing unit 22 and a signal adder 26, wherein, the in-band signal processing unit 21 includes a delay compensation unit 211 and an up-conversion unit 212;

the out-of-band predistortion processing unit 22 includes a power envelope extraction unit 23, a second harmonic injection part 24 and an envelope signal injection part 25, wherein said second harmonic injection part 24 includes a proportion unit 241, a second harmonic up-conversion unit 242 and a phase shifter 243; the envelope signal injection part 25 includes a proportion unit 251, an electronic FIR filter 252, a thermal FIR filter 253 and a signal adder 254.

The base band or IF signal 200 inputted can be divided into an in-band signal branch and an out-of-band signal branch, wherein the in-band signal branch is processed via the in-band signal processing unit 21 to form in-band RF signals. Specifically, the in-band signals are compensated through the delay compensation unit 211 with the time delay introduced by the out-of-band predistortion processing unit 22, and the in-band signals that have been performed delay compensation are up-converted through the up-conversion unit 212 to form the in-band RF signal 210.

The out-of-band branch of the input signal 200 is processed by the out-of-band predistortion processing unit 22 to form out-of-band predistortion signals. Specifically, the power envelope of the out-of-band signals are extracted through the power envelope extraction unit 23, and then the signals are divided into two branches.

The upper branch is processed by the second harmonic injection part 24 to form second harmonic predistortion signal 240. Specifically, first the amplitude of the envelope signals is adjusted to an appropriate size through the proportion unit 241; then the envelope signals are up-converted to the second harmonic frequency through the second harmonic up-conversion unit 242; the phase of the second harmonic signals is shifted by an appropriate angle through the phase shifter 243 to form the final second harmonic predistortion signal 240. The lower branch is processed by the envelope signal injection part to form the envelope injection predistortion signal 250. Specifically, the envelope signal injection part further divides the envelope signals inputted into three sub-branches, with the upper signal branch being proportionally adjusted by proportion unit 251, the middle signal branch being electronically FIR filtered by electronic FIR filter 252 to compensate electronic memory effect of the power amplifier, and the lower signal branch being thermally FIR filtered by thermal FIR filter 253 to compensate thermal memory effect of the power amplifier. The outputs of these three sub-branches are combined in the signal adder 254 to form the final envelope injection predistortion signal 250.

Then, the in-band RF signals 210 and out-of-band predistortion signals (second harmonic predistortion signal 240 and envelope injection predistortion signal 250) are realized adding of broadband through the broadband signal adder 26, and then the signals are sent to the RF power amplifier 27 to be amplified and then to form the output power signal 270.

Figure 3A:
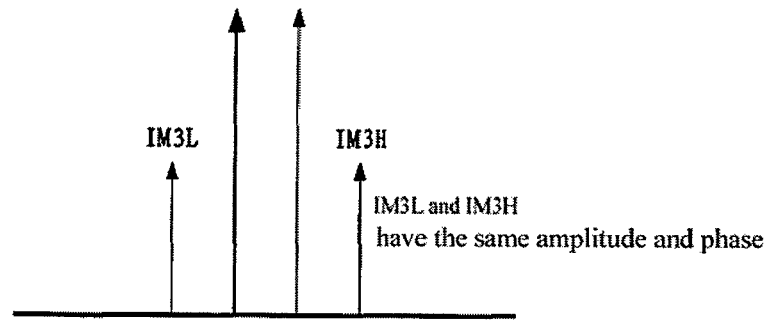
FIG. 3A is a diagram showing the distortion characteristic of a RF power amplifier under the condition that the upper sideband and lower sideband intermodulation distortion components of the amplifier have the same amplitudes and phases.

FIG. 3A shows the distortion characteristic of RF power amplifier under a certain condition, wherein, as shown in the figure, the upper sideband intermodulation distortion component (IM3H) and lower sideband intermodulation distortion component (IM3L) of the amplifier have the same amplitudes and phases.

Figure 3B:
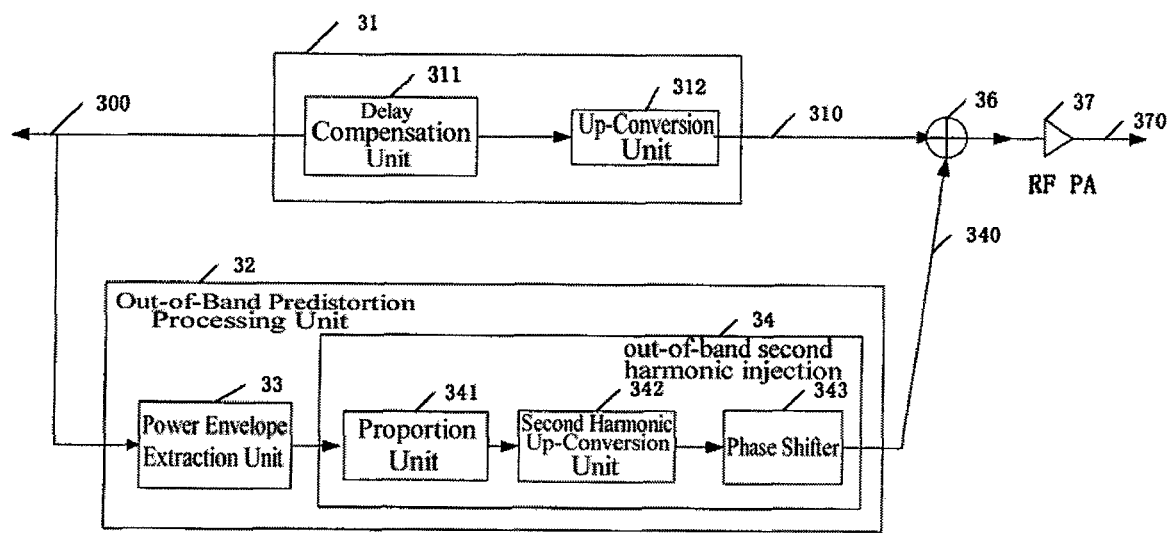
FIG. 3B is a structural diagram of a out-of-band predistortion linearization system under the condition that the upper sideband and lower sideband intermodulation distortion components of the amplifier have the same amplitudes and phases according to one embodiment of this invention.

FIG. 3B is a structural diagram of a simplified system for out-of-band predistortion linearization under the condition that the upper and lower sideband intermodulation distortion components of the amplifier have the same amplitudes and phases in accordance with an embodiment of the present invention.

In the present invention, the process for out-of-band predistortion signals comprises two parts: one is for producing the second harmonic predistortion signals and the other for producing the envelope injection predistortion signals. Under the condition of this embodiment, since the upper and lower sideband intermodulation distortion components of the amplifier have the same amplitudes and phases, it can only adopt the second harmonic predistortion signals produced by the second harmonic injection part. Specifically, as shown in FIG. 3B, firstly, the power envelope extraction unit 33 of the out-of-band predistortion processing unit 32 extracts the power envelope of the inputted signals from the out-of-band branch of the input signal 300; then the proportion unit 341 of the second harmonic injection part 34 adjusts the amplitude of the envelope signals to an appropriate size; then, the second harmonic up-conversion unit 342 up-converts the envelope signals to the second harmonic frequency; last, the phase shifter 344 shifts the phase of the second harmonic signals to form the final second harmonic predistortion signal 340. The in-band signal branch of the input signal 300 is performed delay compensation by the delay compensation unit 311 of the in-band signal processing unit 31, and then is up-converted by the up-conversion unit 312 to radio frequency to form the in-band RF signal, which then combines with the second harmonic predistortion signal 340 in the signal adder 36, and enters the RF power amplifier 37 to be amplified to form the final RF output signal 370.

Figure 4A:
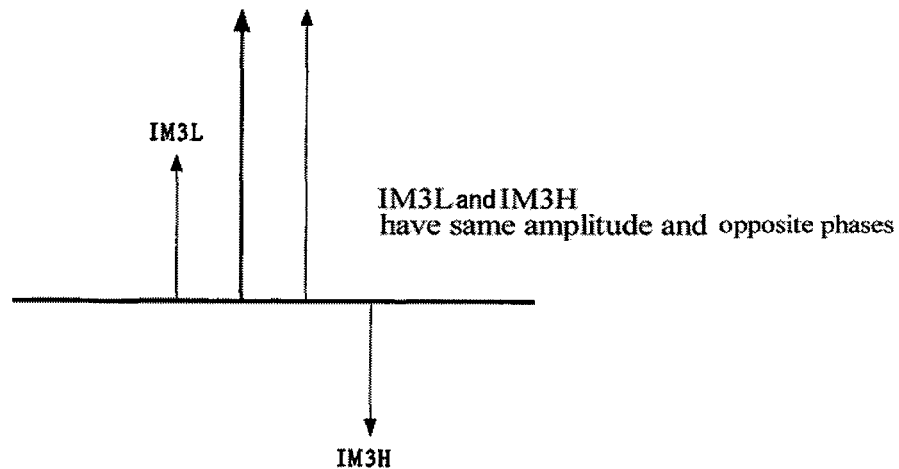
FIG. 4A is a diagram showing distortion characteristic of a RF power amplifier under the condition that the upper sideband and lower sideband intermodulation distortion components of the amplifier have the same amplitudes and opposite phases.

FIG. 4A shows the distortion characteristic of the RF power amplifier under a certain condition, wherein, as shown in the figure, the upper sideband intermodulation distortion component (IM3H) and the lower sideband intermodulation distortion component (IM3L) of the amplifier have the same amplitudes and opposite phases.

Figure 4B:
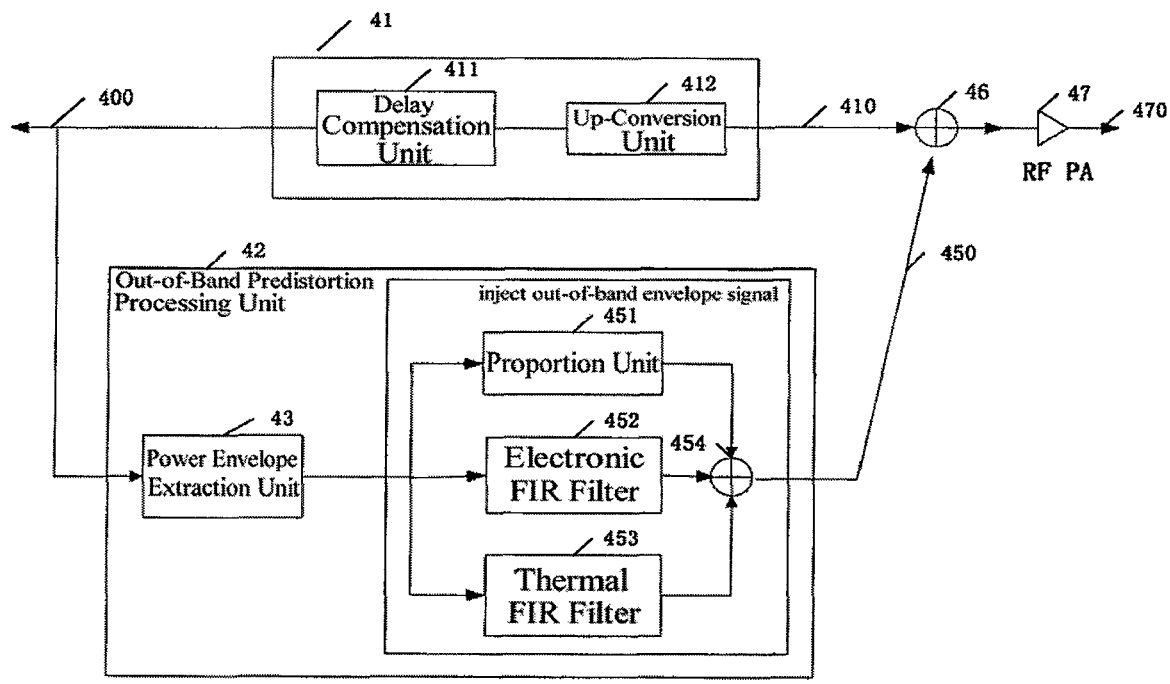
FIG. 4B is a structural diagram of a out-of-band predistortion linearization system under the condition that the upper sideband and lower sideband intermodulation distortion components of the amplifier have the same amplitudes and opposite phases according to one embodiment of the present invention.
Figure 5A:
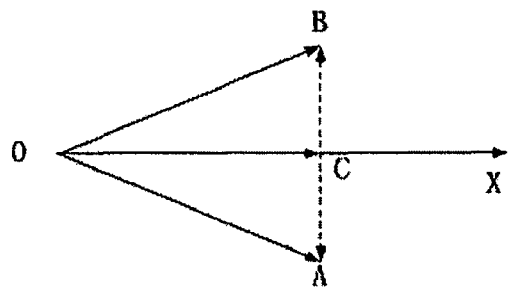
FIGS. 5A-D show the second harmonic predistortion vector and envelope injection predistortion vector required under the condition that the upper sideband and lower sideband intermodulation distortion components of the RF power amplifier have different amplitudes and phases.
Figure 5B:
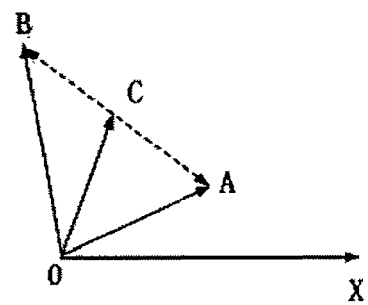
Figure 5C:
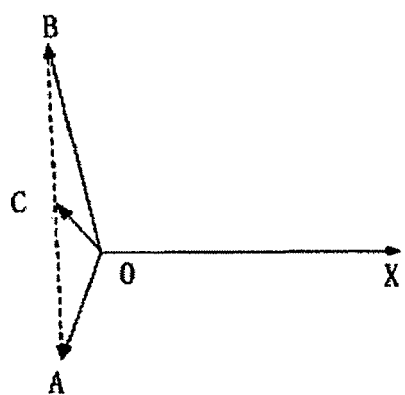
Figure 5D:
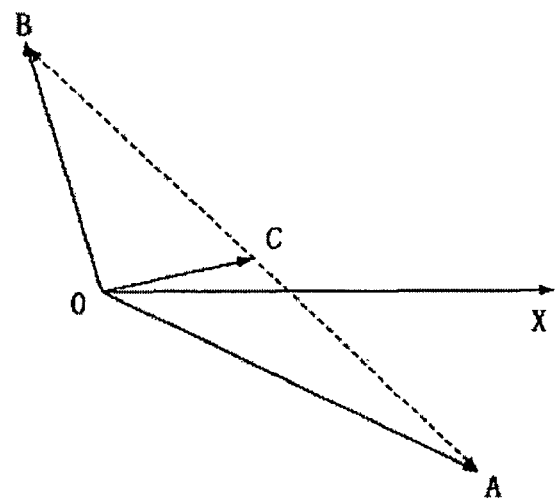

FIG. 4B is a structural diagram of a system for out-of-band predistortion linearization under the condition that the upper and lower sideband intermodulation distortion components of the amplifier have the same amplitudes and opposite phases in accordance with an embodiment of the present invention. In this embodiment, since the upper and lower sideband intermodulation distortion components have the same amplitudes and opposite phases, it can only adopt the envelope injection predistortion signals produced by the envelope signal injection unit. Specifically, as shown in FIG. 4B, firstly, the power envelope extraction unit 43 of the out-of-band predistortion processing unit 42 extracts the power envelope of the input signal from the out-of-band branch of input signal 400; then the envelope signals are divided into three sub-branches in the envelope signal injection part 45, with the upper sub-branch being adjusted amplitude proportionally by the proportion unit 451, the middle sub-branch being filtered by the electronic FIR filter 452 to compensate electronic memory effect of the power amplifier, and the lower sub-branch being filtered by the thermal FIR filter 453 to compensate thermal memory effect of the power amplifier; then these three sub-branches are added by signal adder 454 to form the final envelope injection predistortion signals. The in-band signal branch of the input signal 400 is performed delay compensation by the delay compensation unit 411 of the in-band signal processing unit 41, and then is up-converted to radio frequency by the up-conversion unit 412 to form the in-band RF signal, which then combines with the envelope injection predistortion signal 450 in the signal adder 46, and enters the RF power amplifier 47 to be amplified to form the final RF output signal 470.

FIGS. 5A-D show four conditions of the second harmonic predistortion vector and envelope injection predistortion vector required when the upper and lower sideband intermodulation distortion components of the RF power amplifier have different amplitudes and phases. In the figures, vector OA and vector OB represent the upper sideband distortion vector and the lower sideband distortion vector respectively; OC represents predistortion vector with the same phase, i.e., second harmonic predistortion vector; CA and CB represent predistortion vectors with opposite phases, i.e., envelope injection predistortion vectors. The specific operation of OC and CA/CB is: connecting the ends of the distortion vectors OA and OB to form line AB, connecting point O and the middle point of AB, as such, OC is predistortion vector with the same phase, while CA and CB are predistortion vectors with opposite phases.

Figure 6:
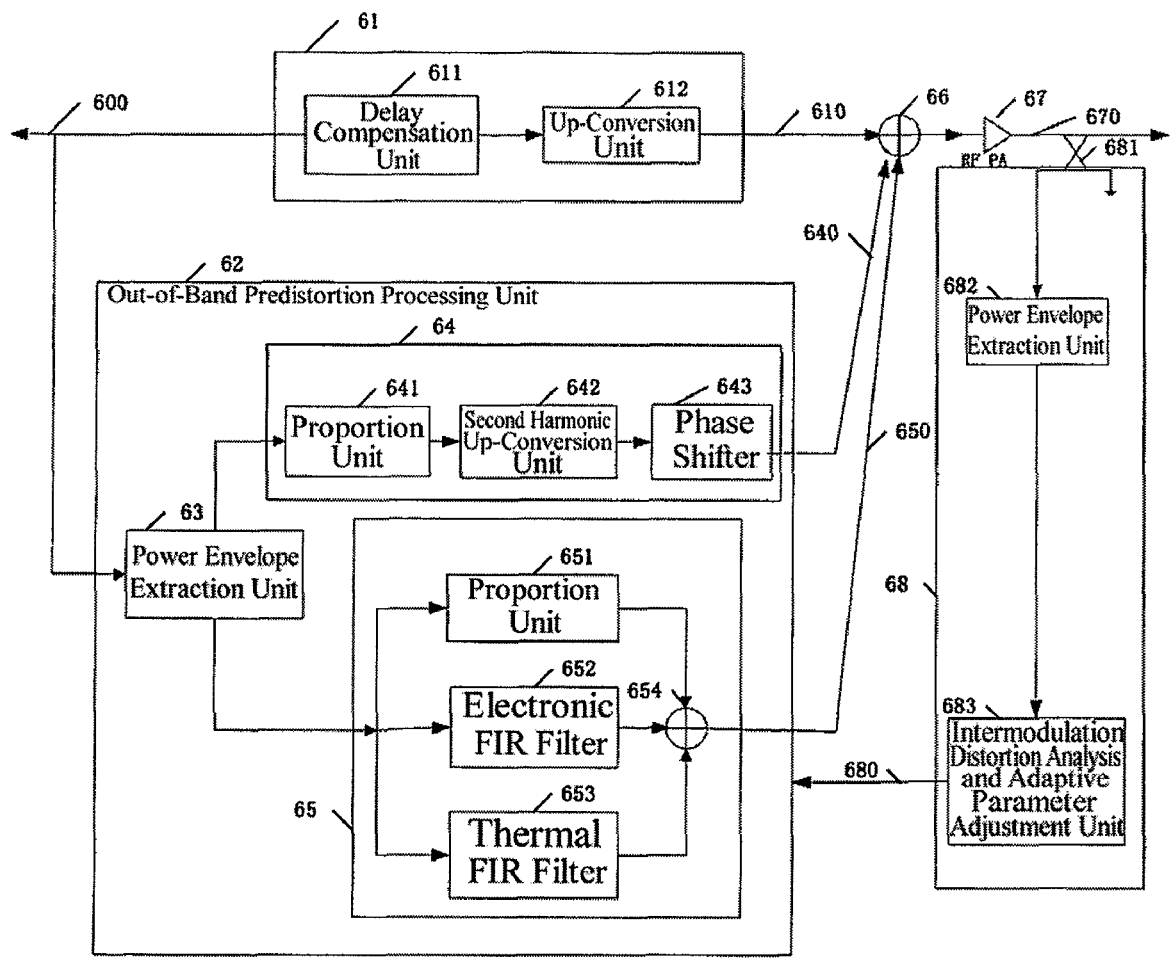
FIG. 6 is a structural diagram of an out-of-band predistortion linearization system according to one embodiment of this invention.

FIG. 6 is a structural diagram of a system for out-of-band predistortion linearization in accordance with an embodiment of the present invention, wherein an adaptive predistortion parameter feedback adjustment part is added in the system. Compared with FIG. 2, the added feedback adjustment part 68 includes: a signal coupler 681, a power envelope extraction unit 682, and an intermodulation distortion analysis and adaptive parameter adjustment unit 683, wherein the signal coupler 681 extracts part of output signals 670 of the amplifier as feedback reference signals, then the power envelope extraction unit 682 extracts the power envelope of the feedback reference signals, the intermodulation distortion analysis and adaptive parameters adjustment unit 683 calculates the amount of the intermodulation distortion component of the envelope signals and analyzes the intermodulation distortion of the amplifier output based on the calculation result, and adaptively adjusts the predistortion compensation parameters of the out-of-band predistortion processing unit.

The present invention provides a brand new concept and method for out-of-band predistortion linearization, which can avoid the limitation in improving performance of conventional predistortion methods, decrease the sensitive degree of linearization effect to signal peak-to-average ratio, solve the problem that the memory effect limits the bandwidth and performance of the predistortion system, and make the predistortion linearization technique achieve, in the true sense, the broad bandwidth and high performance that the feed forward technique has. Meanwhile, the present invention significantly simplifies the design of the predistortion system and reduces the cost of the system.

The present invention can be applied to, but is not limited to the base station subsystem of the third generation mobile communication, wireless local network and other environments requiring broadband linear amplification. The present invention, when employing proper forms, is also applicable to the linearization of power amplifier of a mobile terminal.

I claim:

1. A method for out-of-band predistortion linearization, the method comprising:

dividing input base band or IF signals into a first set of two branches, including in-band signals and out-of-band signals;

processing said in-band signals to form RF signals;

processing said out-of-band signals to form out-of-band predistortion signals for pre-compensating said in-band signals, wherein said processing includes extracting a power envelope from said out-of-band signals;

dividing said out-of-band signals into a second set of two branches of signals;

processing one branch of said second set of two branches of signals to form second harmonic predistortion signals;

processing the other branch of said second set of two branches of signals, upon which power envelope extraction has been performed, to form envelope injection predistortion signals with a low frequency; and adding said second set of two branches of signals that have been processed, and taking the result as said out-of-band predistortion signals; and adding said RF signals with said out-of-band predistortion signals, and taking the result as an input of a RF power amplifier.

2. The method of claim 1, wherein said processing in-band signals further includes:

performing delay compensation for said in-band signals so as to keep said in-band signals synchronizing with said out-of-band signals;

up-converting said in-band signals upon which delay compensation has been performed to a corresponding radio frequency.

3. The method of claim 1, wherein said processing one branch of said second set of two branches of signals further includes:

adjusting said branch proportionally;

up-converting said branch that has been adjusted to a second harmonic frequency; and performing phase shift for said branch that has been up-converted to form said second harmonic predistortion signals.

4. The method of claim 1, wherein said processing the other branch of said second set of two branches of signals further includes:

dividing the other branch into three sub-branches of signals;

adjusting one sub-branch of the three sub-branches of signals proportionally;

electronically finite impulse response (FIR) filtering another sub-branch of the three sub-branches of signals to compensate for an electronic memory effect of the amplifier;

thermally FIR filtering the third sub-branch of the three sub-branches of signals to compensate for a thermal memory effect of the amplifier;

adding said three sub-branches of signals that have been processed to form said envelope injection predistortion signals.

5. The method of claim 1, wherein the method further includes:

adjusting compensation parameters that are used in said processing said second set of two branches of out-of-band signals according to feedback reference signals extracted from output signals of the RF power amplifier.

6. The method of claim 5, wherein said adjusting compensation parameters further includes:

extracting a part of signals from the output signals of the RF power amplifier;

extracting a power envelope from the extracted signals;

calculating an amount of intermodulation distortion component based on said power envelope signals; and adaptively adjusting the compensation parameters used in said processing said out-of-band predistortion signals based on the amount of intermodulation distortion component calculated.

7. A system for out-of-band predistortion linearization, comprising:

an in-band signal processing unit, for processing branches of in-band signals to form in-band RF signals;

an out-of-band predistortion processing unit, for processing branches of out-of-band signals to form out-of-band predistortion signals for pre-compensating said in-band signals, wherein said out-of-band predistortion processing unit further comprises:

a power envelope extraction unit, for extracting a power envelope from out-of-band signals inputted;

a second harmonic injection part, for processing one branch of said out-of-band signals upon which power envelope extraction has been performed to form second harmonic predistortion signals;

an envelope signal injection part, for processing the other branch of said out-of-band signals upon which power envelope extraction has been performed to form envelope injection predistortion signals;

wherein, said out-of-band signals first enter into said power envelope extraction unit, and are divided into two branches after performing power envelope extraction, and the two branches enter into said second harmonic injection part and envelope signal injection part respectively to form said second harmonic predistortion signals and said envelope injection predistortion signals, and the formed second harmonic predistortion signals and envelope injection predistortion signals arrive at a signal adder simultaneously;

said signal adder, adding the in-band RF signals formed by said in-band signal processing unit with out-of-band predistortion signals formed by said out-of-band predistortion processing unit;

wherein, base band or IF signals inputted to the system are divided into two branches, that is in-band signals and out-of-band signals, said two branches of signals enter into said in-band signal processing unit and out-of-band predistortion processing unit respectively, and are processed to form in-band RF signals and out-of-band predistortion signals respectively, which are added in said signal adder to form the input of an RF power amplifier.

8. The system of claim 7, wherein said second harmonic injection part further comprises:

a proportion unit, for adjusting amplitude of signals entering into the second harmonic injection part;

a second harmonic up-conversion unit, for up-converting the signals that have been amplitude-adjusted to a second harmonic frequency;

a phase shifter, for shifting the phase of the up-converted signals by an angle;

wherein, said out-of-band signals entering into the second harmonic injecting part first arrive at said proportion unit for adjustment, then are up-converted by said second harmonic up-conversion unit, then are phase-shifted by said phase shifter to form said second harmonic predistortion signals.

9. The system of claim 7, wherein said envelope signal injection part further comprises:
- a proportion unit, for adjusting amplitude of one sub-branch of signals entering into the envelope signal injection part;
- an electronic finite impulse response (FIR) filter, for electronically FIR filtering another sub-branch of signals entering into the envelope signal injecting part for compensating for an electronic memory effect of the amplifier;
- a thermal FIR filter, for thermally FIR filtering the third sub-branch of signals entering into the envelope signal injection part for compensating for a thermal memory effect of the amplifier;
- a signal adder, for adding the three sub-branches of signals from said proportion unit, said electronic FIR filter and said thermal FIR filter respectively;
- wherein, the signals entering into the envelope signal injection part are divided into three sub-branches, with one sub-branch entering into said proportion unit, another entering into said electronic FIR filter, and the third entering into said thermal FIR filter, these three sub-branches of signals, after being processed, are added up in said signal adder to form said envelope injection predistortion signals.

10. The system of claim 7, wherein the system further comprises:
- a feedback adjustment part, for extracting a part of output signals from the RF power amplifier as feedback reference signals, based on which compensation parameters used by components of said out-of-band predistortion processing unit are adjusted.

11. The system of claim 10, wherein said feedback adjustment part further comprises:
- a signal coupler, for extracting a part of said output signals from the RF power amplifier as the feedback reference signals;
- a power envelope extraction unit, for extracting a power envelope from the feedback reference signals extracted by said signal coupler; and
- an intermodulation distortion analysis and adaptive parameter adjustment unit, for calculating an amount of intermodulation distortion component based on the power envelope signals outputted by said power envelope extraction unit, and adaptively adjusting the compensation parameters used in said out-of-band predistortion processing unit based on the calculated amount of intermodulation distortion component.

12. The system of claim 7, wherein said in-band signal processing unit further comprises:
- a delay compensation unit, for performing delay compensation for said in-band signals so as to keep said in-band signals synchronizing with said out-of-band signals; and
- an up-conversion unit, for up-converting said in-band signals upon which delay compensation to radio frequency has been performed, wherein said in-band signals, after having delay compensation performed upon said in-band signals by said delay compensation unit, enter into said up-conversion unit to be up-converted, and then enter into said signal adder.

* * * * *